United States Patent
Tu

[11] Patent Number: 6,136,716
[45] Date of Patent: Oct. 24, 2000

[54] METHOD FOR MANUFACTURING A SELF-ALIGNED STACKED STORAGE NODE DRAM CELL

[75] Inventor: Yeur-Luen Tu, Taichung, Taiwan

[73] Assignee: Worldwide Semiconductor Manufacturing Corporation, Hsinchu, Taiwan

[21] Appl. No.: 09/189,067

[22] Filed: Nov. 9, 1998

[51] Int. Cl.$^7$ .................................................. H01L 21/311
[52] U.S. Cl. ......................... 438/694; 438/695; 438/696; 438/697; 438/699; 438/706; 438/708; 438/719; 438/720; 438/721; 438/723; 438/724
[58] Field of Search .................................. 438/238, 253, 438/396, 706, 694, 695, 696, 697, 699, 708, 719, 720, 721, 723, 724; 257/306

[56] References Cited

U.S. PATENT DOCUMENTS

| | | | |
|---|---|---|---|
| 5,488,011 | 1/1996 | Figura et al. | 438/253 |
| 5,506,166 | 4/1996 | Sandhu et al. | 438/396 |
| 5,677,227 | 10/1997 | Yang et al. | 438/253 |
| 5,705,438 | 1/1998 | Tseng | 438/238 |
| 5,706,164 | 1/1998 | Jeng | 361/321.4 |
| 5,808,335 | 9/1998 | Sung | 257/306 |

*Primary Examiner*—Benjamin L. Utech
*Assistant Examiner*—Binh X. Tran
*Attorney, Agent, or Firm*—Blakely, Sokoloff, Taylor, & Zafman LLP

[57] ABSTRACT

A method for manufacturing a self-aligned stacked storage node DRAM cell on a substrate for a capacitor over bit line (COB) process is disclosed. The method comprises the steps of: forming a first planarized dielectric layer onto the substrate; forming a first planarized barrier layer onto the first dielectric layer; patterning and etching the first barrier layer until the first dielectric layer is reached to form a bit line contact and a storage node contact; forming first sidewall barrier spacers on the sides of the first barrier layer; etching the first dielectric layer until the substrate is reached to form a bit line contact opening and a storage node contact opening; depositing a first conducting layer into and above the bit line contact opening and the storage node contact opening and above the first barrier layer and the first sidewall spacers; depositing a second conducting layer onto the first conducting layer; depositing a cap barrier layer atop the second conducting layer; patterning and etching the first conducting layer, the second conducting layer, and the cap barrier layer to form an intermediate structure above the bit line contact opening and a plug in the storage node opening; forming second sidewall barrier spacers on the sides of the intermediate structure; forming a second dielectric layer onto exposed portions of the first and the second sidewall barrier spacers, the plug and the cap barrier layer; patterning and etching the second dielectric layer leaving a remaining portion only on the intermediate structure; forming a third conducting layer onto exposed portions of the plug, the first and the second side wall barrier spacers, the cap barrier layer, and the remaining portion of the third dielectric layer; and removing the third conducting layer atop the second dielectric layer.

8 Claims, 4 Drawing Sheets

METHOD FOR MANUFACTURING A SELF-ALIGNED STACKED STORAGE NODE DRAM CELL

FIELD OF THE INVENTION

The present invention relates to a method for manufacturing dynamic random access memory (DRAM), and more specifically, to a method for manufacturing a self-aligned stacked storage node DRAM cell.

BACKGROUND OF THE INVENTION

It has been the trend to scale down the sizes of memory cells to increase the integration level and thus memory capacity of a DRAM chip. As the size of DRAMs is decreased, the overlay margin between a storage node contact and a bit line for a capacitor over bit line (COB) process is reduced. This reduction in the overlay margin creates a potential for a short between the storage node contact and the bit line.

Previous methods that have been used to solve this problem resulted in additional mask layer(s) or increased topography height. Therefore, there is a need for a method for manufacturing a DRAM cell that reduces or eliminates the potential for a short, while reducing the number of mask layers used and reducing the topography height.

SUMMARY OF THE INVENTION

A method for manufacturing a self-aligned stacked storage node DRAM cell on a substrate for a capacitor over bit line (COB) process is disclosed. The method comprises the steps of: forming a first dielectric layer onto said substrate; forming a first planarized barrier layer onto said first dielectric layer; patterning and etching said first barrier layer until said first dielectric layer is reached to form a bit line contact and a storage node contact; forming first sidewall barrier spacers on the sides of said first barrier layer; etching said first dielectric layer until said substrate is reached to form a bit line contact opening and a storage node contact opening; depositing a first conducting layer into and above said bit line contact opening and said storage node contact opening and above said first barrier layer and said first sidewall spacers; depositing a second conducting layer onto said first conducting layer; depositing a cap barrier layer atop said second conducting layer; patterning and etching said first conducting layer, said second conducting layer, and said cap barrier layer to form an intermediate structure above said bit line contact opening and a plug in said storage node opening; forming second sidewall barrier spacers on the sides of said intermediate structure; forming a second dielectric layer onto exposed portions of said first and said second sidewall barrier spacers, said plug and said cap barrier layer; patterning and etching said second dielectric layer leaving a remaining portion only on said intermediate structure; forming a third conducting layer onto exposed portions of said plug, said first and said second side wall barrier spacers, said cap barrier layer, and said remaining portion of said third dielectric layer; and removing said third conducting layer atop said second dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
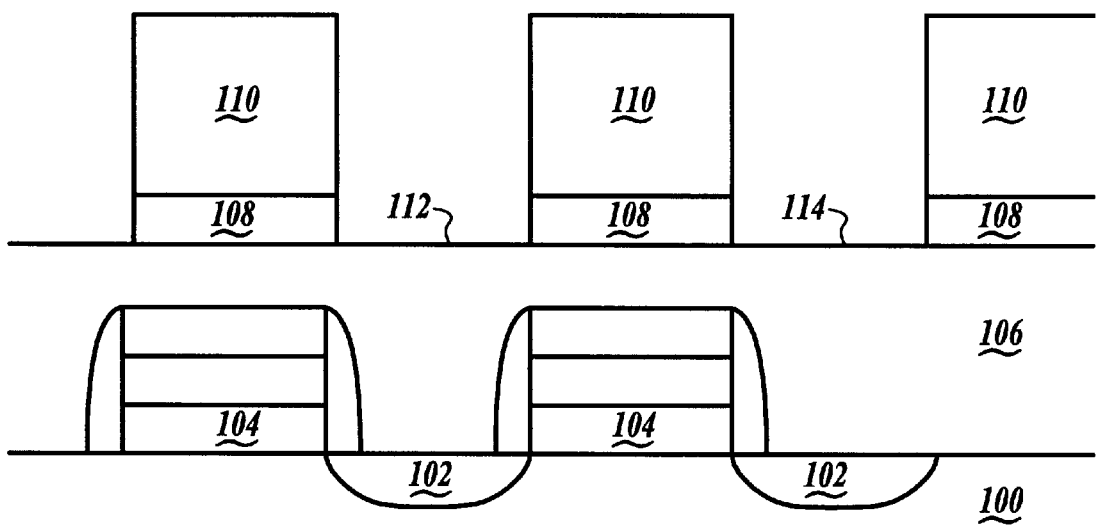
FIGS. 1–8 show cross-sectional views of a semiconductor substrate, showing the steps of forming a DRAM cell in accordance with the present invention.

Referring to FIG. 1, a single crystal P-type substrate 100 is used for the preferred embodiment. Source and drain regions 102 are formed in the substrate 100. A polysilicon gate 104 is created atop the substrate 100. These steps are well-known in the art and will not be discussed further herein.

Still referring to FIG. 1, a dielectric layer 106 is deposited onto the substrate 100 using conventional techniques, such as low pressure chemical vapor deposition (LPCVD) and is planarized. The thickness of the dielectric layer 106 is approximately 1,000 to 3,000 angstroms, and is preferably formed from silicon oxide. Next, a silicon nitride barrier layer 108 is formed onto the dielectric layer 106 by using conventional techniques. In the preferred embodiment, the silicon nitride barrier layer 108 is deposited by LPCVD, using $SiH_2Cl_2$ as the source of deposition, at a temperature between about 700 to 800° C., at a pressure of between about 0.1 to 1 torr. The thickness of the silicon nitride barrier layer 108 is preferably between about 500 to 1,500 angstroms.

Using a single photoresist mask layer 110, a bit line contact 112 and a storage node contact 114 are defined using conventional photolithography and etching processes. For example, the photoresist mask layer 110 may be deposited over the silicon nitride barrier layer 108. Next, the photoresist mask layer is patterned and developed to expose the bit line contact 112 and the storage node contact 114. Finally, an anisotropic etching step may be used to etch the silicon nitride barrier layer 108 until the oxide layer 106 is reached, thereby forming the bit line contact 112 and the storage node contact 114. As an example, the minimum space between the bit line contact 112 and the storage node contact 114 is at least 0.25 micrometers for 0.25 micrometer DRAM generation.

Figure 2:
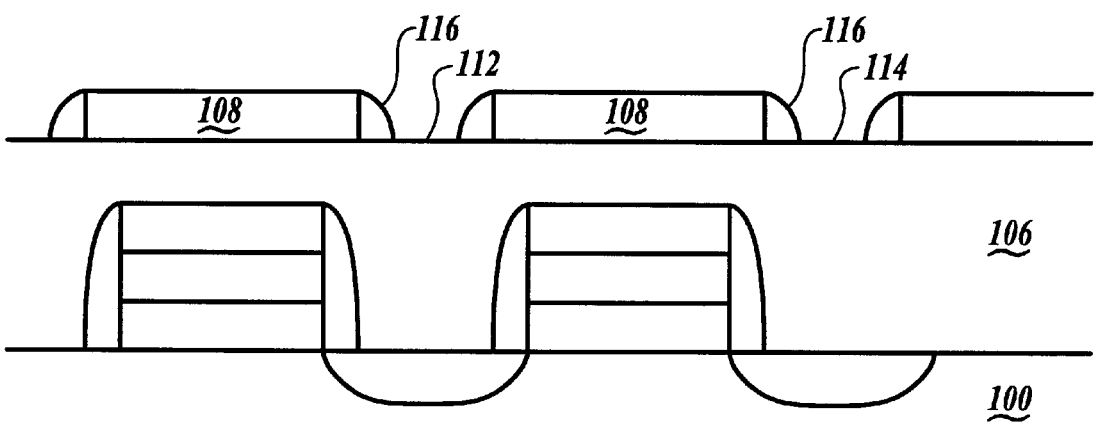

Turning to FIG. 2, a second nitride layer is formed over the barrier layer 108 and the oxide layer 106 (at the bit line contact 112 and the storage node contact 114). The second nitride layer is then anisotropically etched (such as by reactive ion etching) to form nitride spacers 116 along the sidewalls of the silicon nitride barrier layer 108. The nitride spacers 116 are about 500 to 1,000 angstroms across. The storage node contact 114 and the bit line contact 112 are thus reduced, causing an increase in the overlay margin of the storage node contact to the bit line.

Figure 3:
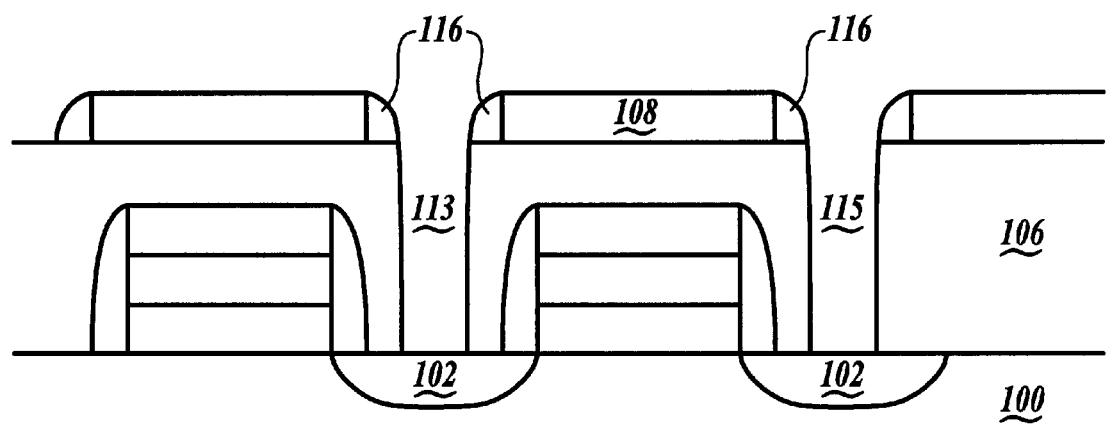

Turning to FIG. 3, a self-aligned contact (SAC) etching process is performed using the nitride spacers 116 and the silicon nitride barrier layer 108 as a hard mask. The oxide layer 106 is thus etched down to the source and drain 102 to form a bit line opening 113 and a storage node opening 115.

Figure 4:
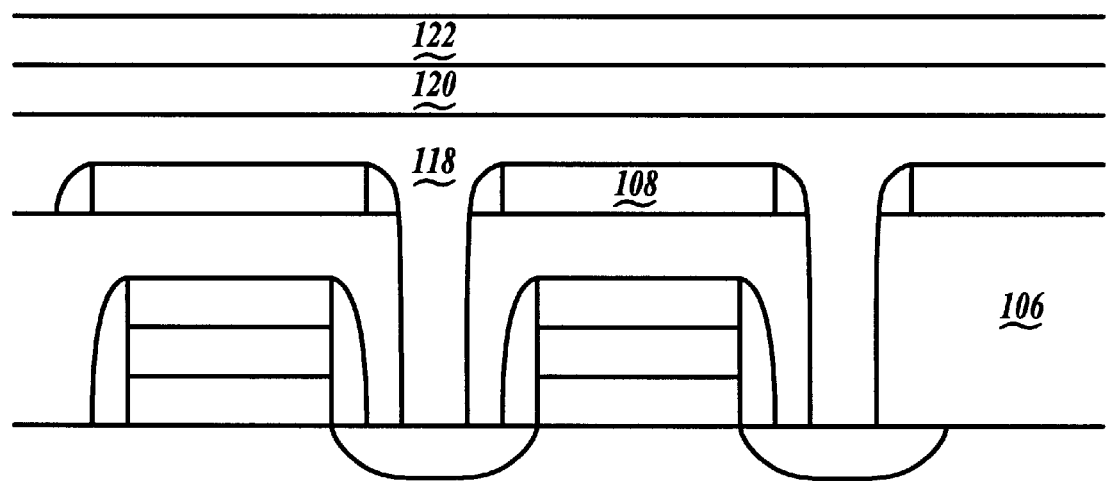

Turning to FIG. 4, an in situ doped polysilicon layer 118 is deposited over the silicon nitride barrier layer 108 and into the bit line opening 113 and the storage node opening 115. In the preferred embodiment, the polysilicon layer 118 is deposited by a conventional chemical vapor deposition. The polysilicon layer 118 has a thickness of about 1,000 angstroms above the barrier layer 108 in the preferred embodiment. Then, a tungsten suicide layer 120 is deposited over the polysilicon layer 118. The tungsten silicide layer 120 is preferably about 1,000 angstroms thick. Next, a silicon nitride cap layer 122 is deposited over the tungsten silicide layer 120. The silicon nitride cap layer 122 is preferably about 500 to 1,500 angstroms.

Figure 5:
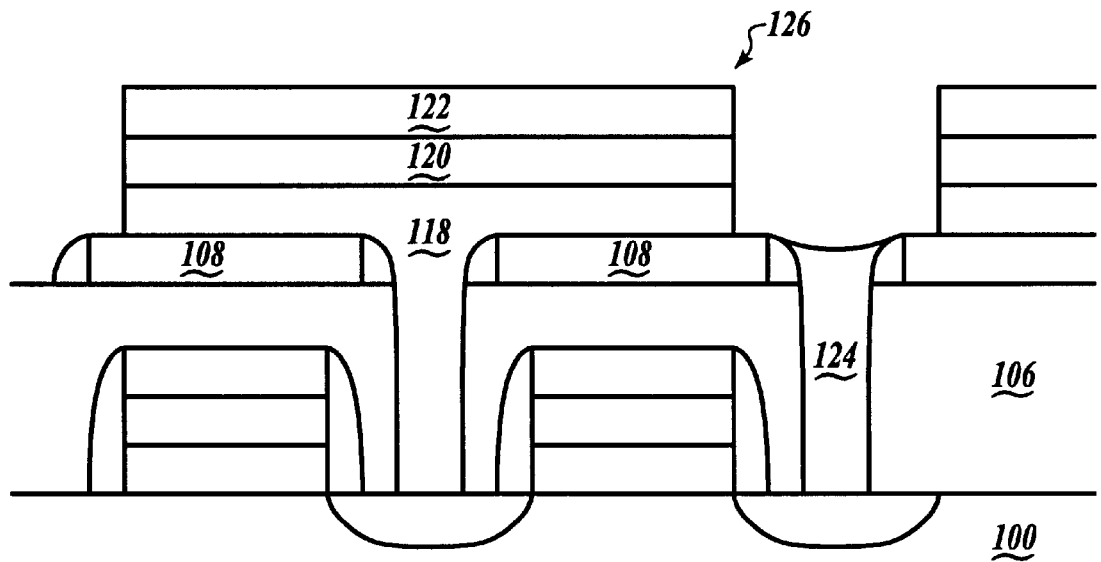

Turning to FIG. 5, the composite layer of polysilicon layer 118, tungsten silicide layer 120, and cap layer 122 is then patterned and etched using conventional techniques. The pattern used to etch the composite layer corresponds to the desired bit line pattern. Because the surface is relatively planarized, about 30% overetching is sufficient to etch through the polysilicon layer 118. This overetching ensures that the polysilicon that is in the storage node opening 115 does not contact the polysilicon forming the bit line. Due to the reduced size of the storage node opening 115, the polysilicon recess in the storage node opening 115 resulting from the etching process is less than 500 angstroms. The completion of the patterning and etching process results in a polysilicon plug 124 in the storage node opening 115 and an intermediate structure 126 centered above the bit line opening 113. FIG. 5 illustrates the resulting structure.

Figure 6:
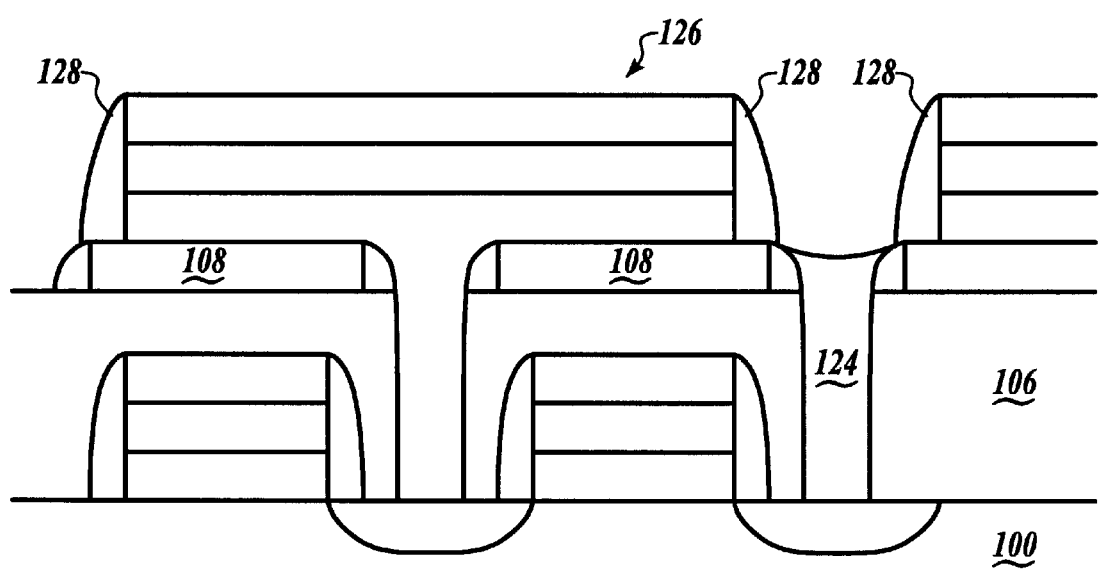

Turning to FIG. 6, yet another nitride layer is then deposited and etched to form intermediate nitride spacers 128 along the sidewalls of the intermediate structure 126. The intermediate nitride spacers 128 are preferably about 500 to 1,000 angstroms across. Overetching of the nitride spacers 128 could be 30 percent or more to ensure that no portion of the nitride spacers 128 remains atop the polysilicon plug 124. Assuming that 30 percent overetching is performed, the thickness of the silicon nitride barrier layer 108 is reduced by 150 to 300 angstroms in thickness.

Figure 7:
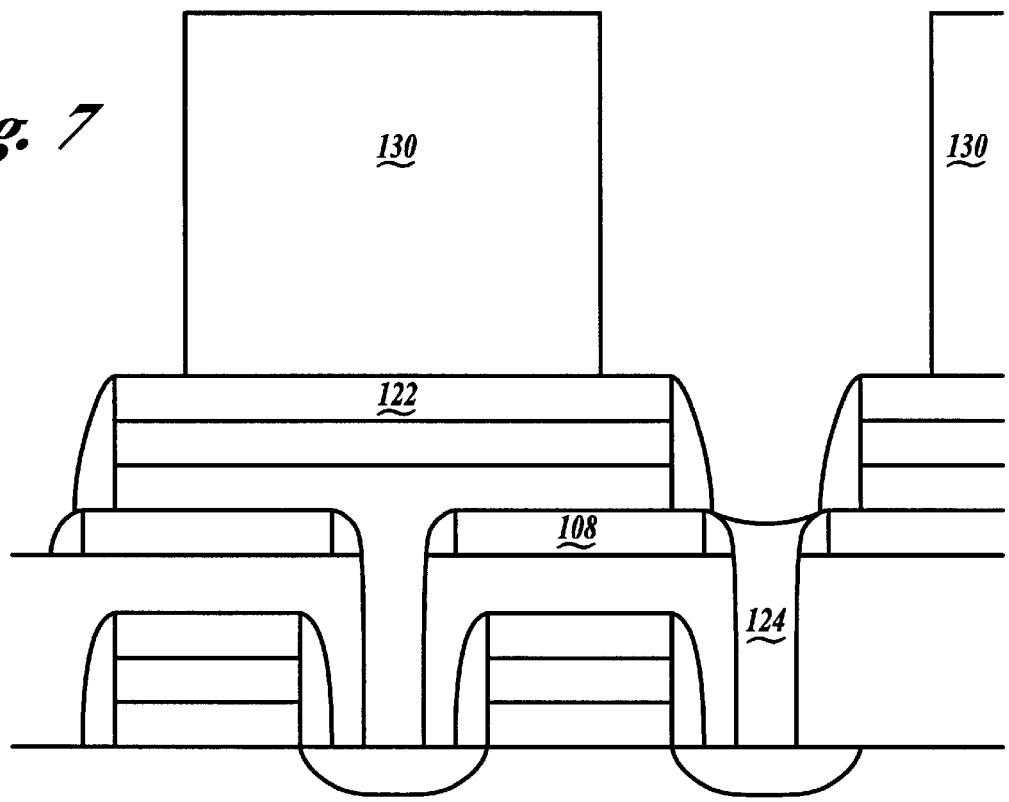

Turning to FIG. 7, a second oxide layer 130 is deposited and planarized using conventional techniques. The thickness of the second oxide layer 130 is approximately 3,000 to 8,000 angstroms. Storage node patterning and etching is then performed. The portion of the second oxide layer 130 directly above the polysilicon plug 124 is completely removed to expose the polysilicon plug 124.

Figure 8:
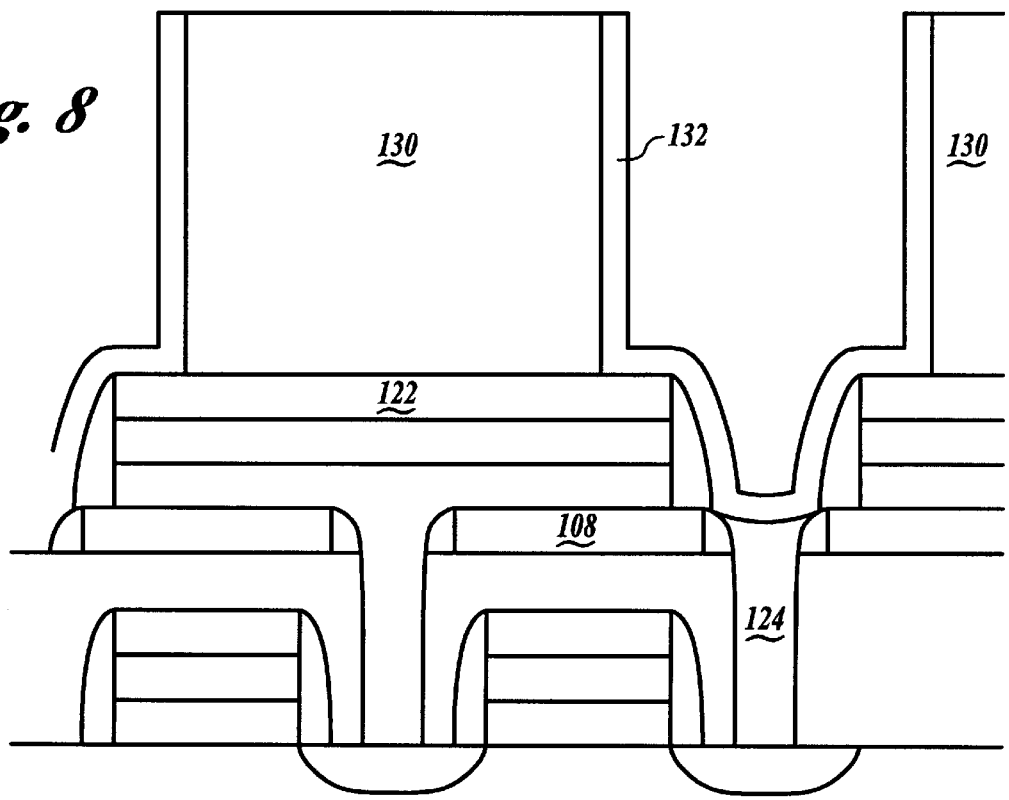

Turning to FIG. 8, a thin in situ doped polysilicon layer 132 is then deposited to connect the polysilicon plug 124 to form a storage node. Preferably, the in situ doped polysilicon layer 132 is deposited using CVD techniques and is about 400 to 700 angstroms thick. The portion of the polysilicon layer 132 atop the second oxide layer 130 is removed by gapfilling photoresist into the opening of the second oxide layer 130, reactive ion etching to remove the photoresist and the polysilicon layer 132, and then stripping of the photoresist. With the bottom storage node being formed by the remaining portion of the polysilicon layer 132, conventional deposition of a dielectric and a capacitor top electrode is performed to finish the capacitor.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a self-aligned stacked storage node on a substrate, the method comprising the steps of:

forming a first dielectric layer onto said substrate;

forming a first barrier layer onto said first dielectric layer;

patterning and etching said first barrier layer until said first dielectric layer is reached to form a bit line contact and a storage node contact;

forming first sidewall barrier spacers on the sides of said first barrier layers wherein said sidewall barrier spacers narrow said bit line contact and said storage node contact;

etching said first dielectric layer until said substrate is reached to form a bit line contact opening and a storage node contact opening;

depositing a first conducting layer into and above said bit line contact opening and said storage node contact opening and above said first barrier layer and said first sidewall barrier spacers;

depositing a second conducting layer onto said first conducting layer;

depositing a cap barrier layer atop said second conducting layer;

patterning and etching said first conducting layer, said second conducting layer, and said cap barrier layer to form an intermediate structure above said bit line contact opening and a plug in said storage node opening;

forming second sidewall barrier spacers on the sides of said intermediate structure;

forming a second dielectric layer onto exposed portions of said first and said second sidewall barrier spacers, said plug and said cap barrier layer;

patterning and etching said second dielectric layer leaving a remaining portion only on said intermediate structure; and forming a third conducting layer onto exposed portions of said plug, said first and said second sidewall spacers, said cap barrier layer, and sidewalls of said remaining portion of said third dielectric layer.

2. The method of claim 1, wherein said first dielectric layer and said second dielectric layer are formed of silicon oxide.

3. The method of claim 1, wherein said first barrier layer, said cap barrier layer, said first sidewall spacers and said second sidewall spacers are formed of silicon nitride.

4. The method of claim 1, wherein said first conducting layer and said third conducting layer are formed of in situ doped polysilicon.

5. The method of claim 1, wherein said second conducting layer is formed of tungsten silicide.

6. The method of claim 1, wherein the step of patterning and etching said first barrier layer to form a bit line contact and a storage node contact is performed using a single photoresist mask layer.

7. The method of claim 1 wherein the recess of said plug is less than 500 angstroms.

8. The method of claim 1 wherein said step of etching to form said intermediate structure is performed with an approximately 30% overetching.

* * * * *